(12) United States Patent
Ashizawa et al.

(10) Patent No.: US 7,352,156 B2
(45) Date of Patent: Apr. 1, 2008

(54) STATE-OF-CHARGE ESTIMATING DEVICE OF SECONDARY BATTERY

(75) Inventors: Hiroyuki Ashizawa, Yokohama (JP); Hideo Nakamura, Yokohama (JP); Hisafumi Asai, Zama (JP)

(73) Assignee: Nissan Motor Co., Ltd., Yokohama-shi (JP)

( * ) Notice: Subject to any disclaimer, the term of this patent is extended or adjusted under 35 U.S.C. 154(b) by 0 days.

(21) Appl. No.: 11/487,882

(22) Filed: Jul. 16, 2006

(65) Prior Publication Data
US 2007/0029973 A1 Feb. 8, 2007

(30) Foreign Application Priority Data
Jul. 19, 2005 (JP) ............... 2005-208068

(51) Int. Cl.
*H02J 7/00* (2006.01)
(52) U.S. Cl. ............... 320/132; 320/149; 324/426; 324/427; 324/429; 324/433
(58) Field of Classification Search ............ 320/127, 320/128, 130, 132, 149; 324/426, 429, 433, 324/427; 702/63
See application file for complete search history.

(56) References Cited

U.S. PATENT DOCUMENTS

| | | | | |
|---|---|---|---|---|
| 6,127,806 A * | 10/2000 | Tanjo et al. | ............ | 320/132 |
| 6,359,419 B1 * | 3/2002 | Verbrugge et al. | ....... | 320/132 |
| 6,845,332 B2 * | 1/2005 | Teruo | ............... | 702/63 |
| 6,987,377 B2 * | 1/2006 | Sakakibara et al. | ..... | 320/132 |
| 7,009,402 B2 * | 3/2006 | Yumoto et al. | ......... | 324/433 |
| 7,136,762 B2 * | 11/2006 | Ono | ............... | 702/63 |

FOREIGN PATENT DOCUMENTS

| | | |
|---|---|---|
| JP | 2003-185719 | 7/2003 |
| JP | 2003-346914 | 12/2003 |
| JP | 2004-079472 | 3/2004 |
| JP | 2004079472 A * | 3/2004 |
| JP | 2004-178848 | 6/2004 |

OTHER PUBLICATIONS

English translation of Yumoto et al.*
English Translation of JP 2004079472 A Mar. 2004 Japan Yumoto et al.*
Takuya Kinoshita, "Kalman Filtering SOC Estimation For Secondary Batteries", (Hitachi, Ltd.), Masato Isogai, (Hitachi Maxell, Ltd.).

* cited by examiner

*Primary Examiner*—Jeffrey Sterrett
*Assistant Examiner*—Stuart Hansen
(74) *Attorney, Agent, or Firm*—Young Basile (57) ABSTRACT

A state-of-charge (SOC) estimating device and method for a secondary battery that estimates the SOC of the battery with high precision when variation takes place in the parameters of the battery model, even if the input current is constant. A first SOC estimating part estimates the open-circuit voltage by estimating the battery parameters en bloc using an adaptive digital filter computing treatment from the measurement values of the current and the terminal voltage and computes a first estimated SOC of the secondary battery from the open-circuit voltage and a predetermined relationship between the open-circuit voltage and the SOC. A second SOC estimating part computes a second estimated SOC by means of current-integration. State-of-charge estimated value-selecting part selects the second SOC value as when the current is constant and otherwise selects the first SOC value.

27 Claims, 6 Drawing Sheets

STATE-OF-CHARGE ESTIMATING DEVICE OF SECONDARY BATTERY

CROSS-REFERENCE TO RELATED APPLICATION

This application claims priority from Japanese Patent Application Serial No. 2005-208068, filed Jul. 19, 2005, the entire contents of which is incorporated herein by reference.

TECHNICAL FIELD

The present invention pertains to a device and method for estimating the state-of-charge (SOC) of a secondary battery.

BACKGROUND

The state-of-charge (SOC) of a secondary battery can be correlated to the open-circuit voltage $V_O$, which is the battery terminal voltage when the current path is cut off, also known as the electromotive force or the open voltage. Consequently, it is theoretically possible to estimate the state-of-charge by estimating the open-circuit voltage $V_O$. However, it takes time for the terminal voltage of the secondary battery to level off after cut-off of the power supply (completion of charge/discharge). In order to estimate open-circuit voltage $V_O$ correctly, a prescribed time is needed from the completion of charge/discharge because right after charge/discharge and during charge/discharge it is impossible to estimate open-circuit voltage $V_O$ correctly. As a result, known devices have estimated open-circuit voltage $V_O$.

In the state-of-charge estimating device described in Japanese Kokai Patent Application No. 2004-178848, for example, current I and terminal voltage V of the secondary battery and an adaptive digital filter computation from a battery model formula are used to estimate the battery parameters in the battery model formula to estimate open-circuit voltage $V_O$. Based on the estimated open-circuit voltage $V_O$ and a previously derived relationship between an open-circuit voltage and a state-of-charge (SOC), state-of-charge (SOC) is estimated from the estimated open-circuit voltage $V_O$.

BRIEF SUMMARY OF THE INVENTION

Embodiments of the invention provide a state-of-charge estimating device and method for a secondary battery that can estimate the state-of-charge with high precision.

For example, one aspect of a state of charge estimating device for estimating a state-of-charge of a secondary battery connected to a load comprises a current detecting device for detecting a current I of the secondary battery, a terminal voltage detecting device for detecting a terminal voltage V of the secondary battery and a controller receiving input from the current detecting device and the terminal voltage detecting device. The controller can include an open circuit voltage estimating part operable to perform an adaptive digital filter computing treatment to estimate at least one battery parameter in a battery model $$V = \frac{B(s)}{A(s)} \cdot I + \frac{1}{A(s)} \cdot V_O$$

en bloc based on the current I and terminal voltage V of the secondary battery and the battery model $$V = \frac{B(s)}{A(s)} \cdot I + \frac{1}{A(s)} \cdot V_O$$

and to estimate an estimated open circuit voltage $V_O$ of the secondary battery wherein A(s) and B(s) are polynomials of Laplace operator s, a first state of charge estimating part operable to estimate a first state of charge value based on the estimated open circuit voltage $V_O$ of the secondary battery and a previously derived relationship between an open circuit voltage and a state of charge of the secondary battery, a second state of charge estimating part operable to estimate a second state of charge value using a method capable of estimating the state of charge even if the current I is constant while one or more of the at least one battery parameter varies and a state of charge estimated value-selecting part operable to select the second state of charge value as the state-of-charge when the current I is constant and otherwise to select the first state of charge value as the state-of-charge.

In another example of a state-of-charge estimating device for estimating a state-of-charge of a secondary battery connected to a load, the device includes means for detecting a current I through the secondary battery, means for detecting a terminal voltage V of the secondary battery, open-circuit voltage estimating means for performing an adaptive digital filter computing treatment to estimate at least one battery parameter in a battery model $$V = \frac{B(s)}{A(s)} \cdot I + \frac{1}{A(s)} \cdot V_O$$

en bloc based on the current I and terminal voltage V of the secondary battery and the battery model $$V = \frac{B(s)}{A(s)} \cdot I + \frac{1}{A(s)} \cdot V_O$$

and to estimate an estimated open-circuit voltage $V_O$ of the secondary battery wherein A(s) and B(s) are polynomials of Laplace operator s and state-of-charge estimating means for estimating the state-of-charge based on the estimated open-circuit voltage $V_O$ of the secondary battery and a previously derived relationship between an open-circuit voltage and a state-of-charge of the secondary battery when the current I is not constant and for estimating the state-of-charge using a state-of-charge estimating method that allows estimation of the state-of-charge excluding the open-circuit voltage $V_O$ when the current I is constant.

Also taught herein are methods of estimating a state-of-charge of a secondary battery connected to a load. One example of such a state-of-charge estimating method comprises detecting a current I through the secondary battery, detecting a terminal voltage V of the secondary battery, performing an adaptive digital filter computing treatment to estimate at least one battery parameter in a battery model $$V = \frac{B(s)}{A(s)} \cdot I + \frac{1}{A(s)} \cdot V_O$$

en bloc based on the current I and terminal voltage V of the secondary battery and the battery model $$V = \frac{B(s)}{A(s)} \cdot I + \frac{1}{A(s)} \cdot V_O$$

and to estimate an estimated open circuit voltage $V_O$ of the secondary battery wherein A(s) and B(s) are polynomials of Laplace operator s, and estimating a first state of charge value based on the estimated open circuit voltage $V_O$ of the secondary battery and a previously derived relationship between an open circuit voltage and a state of charge of the secondary battery, estimating a second state of charge value using a method capable of estimating the state of charge even if the current I is constant while one or more of the at least one battery parameter varies, selecting the second state of charge value as the state-of-charge when the current I is constant and selecting the first state of charge value as the state-of-charge when the current I varies.

BRIEF DESCRIPTION OF THE DRAWINGS

The description herein makes reference to the accompanying drawings wherein like reference numerals refer to like parts throughout the several views, and wherein.

DETAILED DESCRIPTION OF EMBODIMENTS OF THE INVENTION

For a device that estimates $V_O$ such as that described above, imprecision exists because when the input current value I is constant and the true values of parameters (for example, internal resistance) of the battery model change, the estimated value of the adaptive digital filter computing treatment cannot follow the changes. This is due to the adaptive digital filter computing treatment. Usually, if there is no frequency component corresponding to the parameters of the battery model in the input signal, one cannot estimate the parameters correctly. Consequently, for example, for a secondary battery having the characteristic that the internal resistance increases while discharge at a constant current continues (for example, for several seconds) such as a lithium ion battery, it is impossible to estimate the various parameters and state-of-charge (SOC) with high precision.

In contrast, embodiments of the invention can provide a more precise indication of the state-of-charge. In a second state-of-charge estimating part, for example, by integrating the detected current it is possible to estimate the state-of-charge. Usually, a state-of-charge estimated by a first state-of-charge estimating part with adaptive digital filtering for high precision is used, discharge at a constant value is continued, and soon the internal resistance rises (or falls) so that the state-of-charge estimated by the first state-of-charge estimating part is generated. In this case, the estimated state-of-charge is selected by the second state-of-charge estimating part. Consequently, it is possible to estimate the state-of-charge (SOC) with precision at all times.

Figure 1:
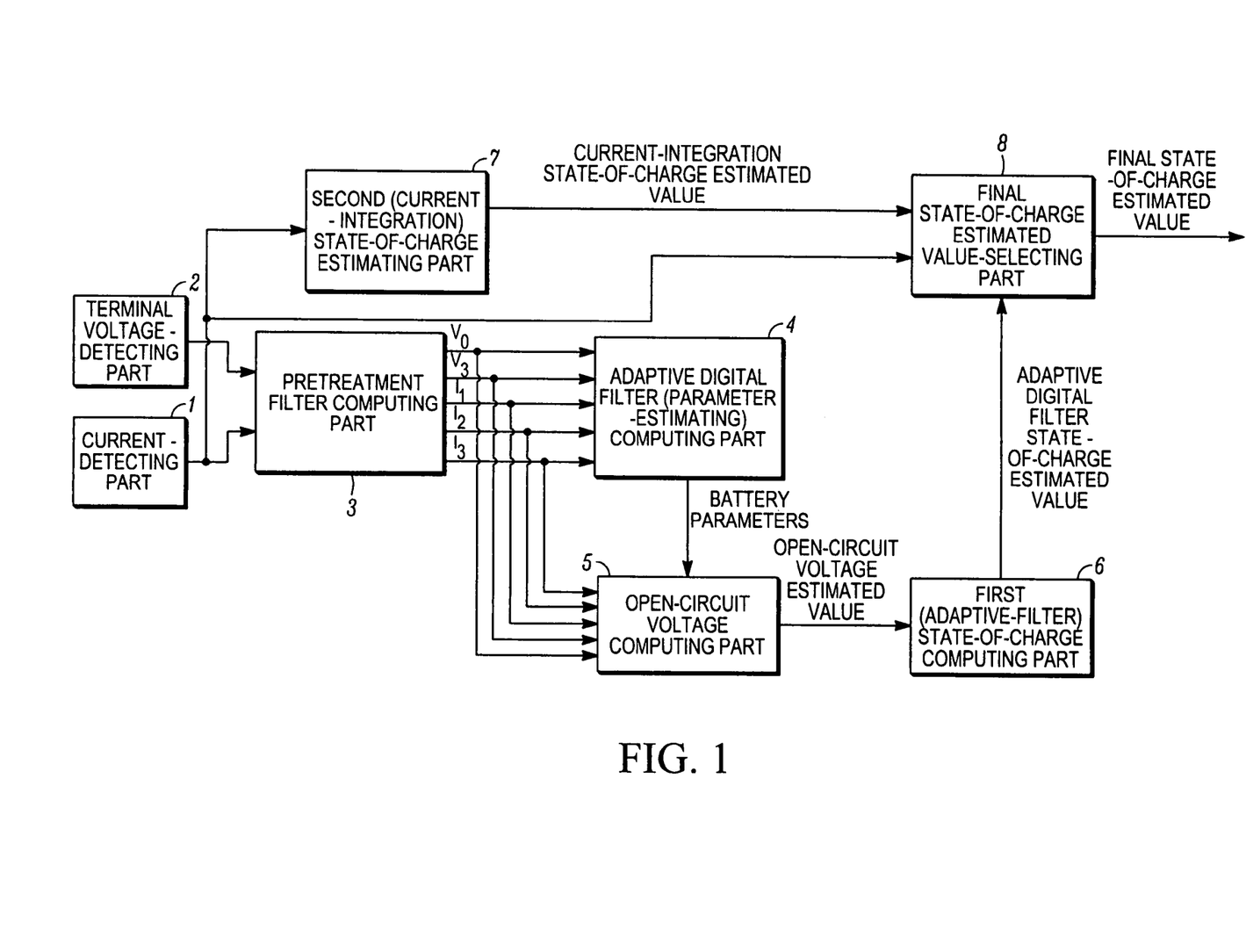
FIG. 1 is a functional block diagram of one example of a device according to the invention.

FIG. 1 is a functional block diagram according to one example of the invention. Shown in FIG. 1 are a current-detecting part 1 that detects current I of the secondary battery (hereinafter to be referred to as a battery), a terminal voltage-detecting part 2 that detects terminal voltage V of the battery, a pretreatment filter computing part 3, a parameter-estimating computing part 4, an open-circuit voltage-computing part 5, a first state-of-charge estimating part 6 (a state-of-charge estimating part that estimates the state-of-charge based on the open-circuit voltage estimated using the adaptive digital filter computing treatment) that computes the state-of-charge (SOC) from the open-circuit voltage computed with open-circuit voltage computing part 5, a second state-of-charge estimating part 7 that estimates the state-of-charge using the current-integrating method to be explained later (e.g., without using adaptive digital filter computing treatment) and a final state-of-charge estimated value-selecting part 8 that selects and outputs the state-of-charge (i.e., the state-of-charge estimated with first state-of-charge estimating part 6) estimated using the adaptive digital filter computing treatment corresponding to the state of the current detected with current-detecting part 1 or the state-of-charge (i.e., the state-of-charge estimated using second state-of-charge estimating part 7) estimated using the current-integration method.

Pretreatment filter computing part 3 is composed of a low-pass filter or a band-pass filter, to be explained later. Other parts of FIG. 1 are also explained hereinafter.

Figure 2:
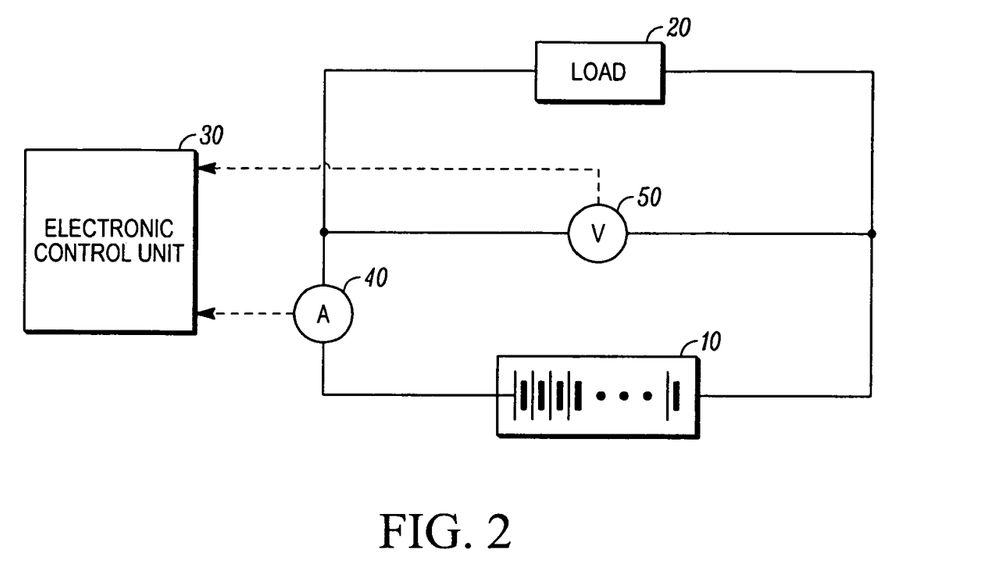
FIG. 2 is a circuit diagram illustrating one example of a device according FIG. 1.

FIG. 2 is a simplified circuit diagram for the device of FIG. 1. In this example, a motor or other load is driven by a secondary battery, or a state-of-charge estimating device of the secondary battery is set in the system that charges the secondary battery with the reproduction power of the motor. FIG. 2 shows a secondary battery 10 (hereinafter also to be referred to as battery) coupled to a motor or other electric load 20, which are connected to an electronic control unit 30 that estimates the state-of-charge of the battery. The electronic control unit 30 is composed of a microcomputer, an electronic circuit, etc., which generally contains a CPU that operates programs, a ROM that stores the programs and a RAM that stores the results of operations. The electronic control unit 30 receives input from an ammeter 40 that detects the current of charge/discharge of the battery 10 and a voltmeter 50 that detects the terminal voltage of the battery 10. Electronic control unit 30 incorporates the functions represented by the following parts shown in FIG. 1: pretreatment filter computing part 3, parameter-estimating computing part 4, open-circuit voltage computing part 5, first state-of-charge estimating part 6, second state-of-charge estimating part 7 and final state-of-charge estimated value-selecting part 8. Also, ammeter 40 is one example of current-detecting part 1, and voltmeter 50 is one example of terminal voltage-detecting part 2.

Figure 3:
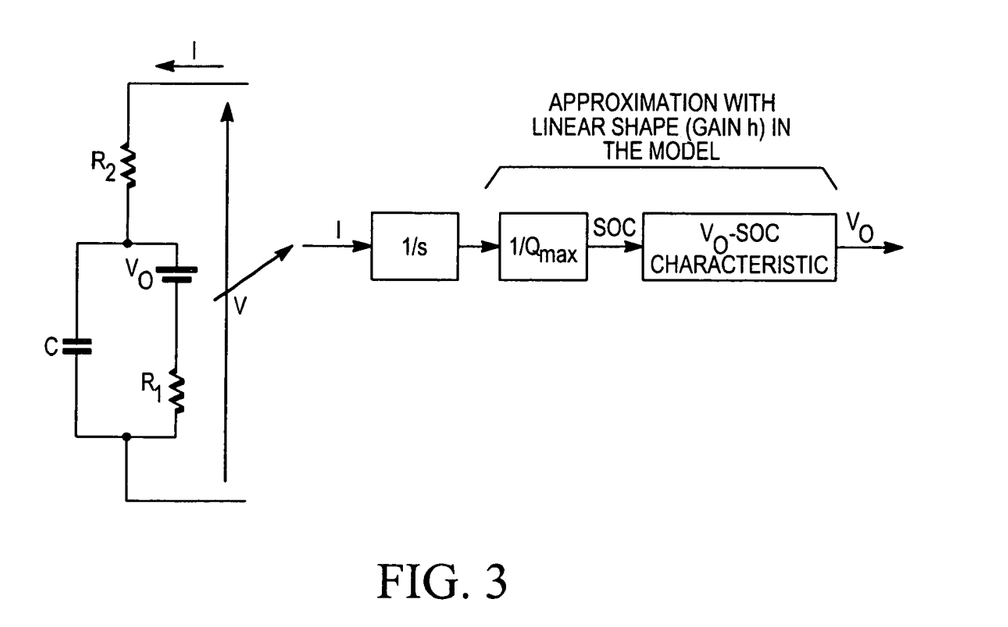
FIG. 3 is a diagram of the equivalent circuit model of a secondary battery.

Next, an explanation is provided for the battery model adopted in the present example. FIG. 3 is a schematic diagram illustrating the equivalent circuit model of a secondary battery. The battery model of this secondary battery is described by the following:

$$V = \frac{C_1 \cdot R_1 \cdot R_2 \cdot s + R_1 + R_2}{C_1 \cdot R_1 \cdot s + 1} \cdot I + \frac{1}{C_1 \cdot R_1 \cdot s + 1} \cdot V_o; \quad \text{(Formula 1)}$$

wherein:

I is current in amps (positive means charge, negative means discharge) input into the model;

V is the terminal voltage in volts output from the model;

$R_1$ in ohms represents a charge movement resistor;

$R_2$ in ohms represents a pure resistor;

$C_1$ in farads represents an electric double layer capacitor;

$V_O$ in volts represents the open-circuit voltage; and s represents the Laplace operator.

This model is a reduction model (primary model) wherein the positive electrode and negative electrode are not specifically separated from each other, yet this model can display the actual charge/discharge characteristics of the battery relatively correctly. Thus, in this example, an explanation will be provided for embodiments of the invention with reference to an example in which the battery model is a primary model.

First, an explanation is provided from the battery model of Formula 1 to derivate the battery parameters by means of the adaptive digital filter computing treatment. More specifically, Formula 1 can be modified to get Formula 2 as described below:

$$V = \frac{K \cdot (T_2 \cdot s + 1)}{T_1 \cdot s + 1} \cdot I + \frac{1}{T_1 \cdot s + 1} V_o; \quad \text{(Formula 2)}$$

wherein:

$$T_1 = C_1 \cdot R_1;$$
$$T_2 = \frac{C_1 \cdot R_1 \cdot R_2}{R_1 + R_2}; \text{ and}$$
$$K = R_1 + R_2.$$

The battery parameter K corresponds to the value of the internal resistance of the battery model.

Open-circuit voltage $V_O$ is obtained by multiplying variable efficiency h by current I, followed by integration from a certain initial state. From this, one gets the following formula:

$$V_o = \frac{h}{s} I. \quad \text{(Formula 3)}$$

Substituting Formula 3 into Formula 2, one obtains Formula 4 as shown below:

$$V = \frac{K \cdot (T_2 \cdot s + 1)}{T_1 \cdot s + 1} \cdot I + \frac{1}{T_1 \cdot s + 1} \cdot \frac{h}{s} \cdot I \quad \text{(Formula 4)}$$

that becomes, after rearrangement, Formula 5 as shown below:

$$V = \frac{K \cdot T_2 \cdot s^2 + K \cdot s + h}{T_1 \cdot s^2 + s} \cdot I \quad \text{(Formula 5)}$$

Multiplying stable low-pass filter $G_{LPF}(s)$ to both sides of Formula 5 and rearranging the formula results in Formula 6.

$$G_{LPF}(s) \cdot (T_1 \cdot s^2 + s) \cdot V = G_{LPF}(s) \cdot (K \cdot T_2 \cdot s^2 + K \cdot s + h) \cdot I \quad \text{(Formula 6)}$$

The formula below, Formula 7, is the general formula (continuous time system) of the battery model.

$$V = \frac{B(s)}{A(s)} \cdot I + \frac{1}{A(s)} \cdot V_o \quad \text{(Formula 7)}$$

A(s) and B(s) are polynomials of Laplace operator s wherein $$A(s) = \sum_{k=0}^{n} a_k \cdot s^k$$

and $$B(s) = \sum_{k=0}^{n} b_k \cdot s^k.$$

The current estimation round is represented by k, and n is a total number of estimation rounds. Where n=1, A(s) and B(s) in Formula 7 are as follows:

$A(s) = T_1 \cdot s + 1;$ and $B(s) = K(T_2 \cdot s + 1);$ where $T_1 = C_1 \cdot R_1;$ $T_2 = (C_1 \cdot R_1 \cdot R_2)/(R_1 + R_2);$ and $K = R_1 + R_2.$ then Formula 7 becomes the same as Formula 1, and the following Formula 8

$$G_{LPF}(s) \cdot A(s) \cdot s \cdot V = G_{LPF}(s) \cdot \{B(s) \cdot s + h\} I \quad \text{(Formula 8)}$$

becomes the same as Formula 6.

Also, by multiplying the same low-pass filter $G_{LPF}(s)$ as above to both sides of Formula 7 and rearranging results in the following Formula 9.

$$G_{LPF}(s) \cdot V_O = G_{LPF}(s) \cdot A(s) \cdot V - G_{LPF}(s) \cdot B(s) \cdot I \quad \text{(Formula 9)}$$

As explained above, in this application example, by substituting Formula 3 obtained by assuming an integration characteristic as the relationship between the open-circuit voltage and current into the battery model (continuous time system) in Formula 7, and by pretreatment filtering both sides, one obtains Formula 8 with parameters (coefficients in polynomials A(s), B(s)) that can be determined en bloc by means of the adaptive digital filter computing treatment.

Then, the values obtained by treatment of the low-pass filter and band-pass filter on current I and terminal voltage V that can actually be measured are defined by the following Formulas 10.

$V_3 = s^2 \cdot G_{LPF}(s) \cdot V$ (Formulas 10)

$V_2 = s \cdot G_{LPF}(s) \cdot V$ $V_1 = G_{LPF}(s) \cdot V$ $I_3 = s^2 \cdot G_{LPF}(s) \cdot I$ $I_2 = s \cdot G_{LPF}(s) \cdot I$ $I = G_{LPF}(s) \cdot I$ Here, $G_{LPF}(s)$ represents the low-pass filter, and $s \cdot G_{LPF}(s)$ and $s^2 \cdot G_{LPF}(s)$ represent the band-pass filter.

When Formulas 10 are used to re-write Formula 6, one obtains the following Formula 11.

$T_1 \cdot V_3 + V_2 = K \cdot T_2 \cdot I_3 + K \cdot I_2 + h \cdot I_1$ (Formula 11)

After further rearrangement, one obtains Formula 12.

$V_2 =$ (Formula 12)

$$-T_1 \cdot V_3 + K \cdot T_2 \cdot I_3 + K \cdot I_2 + d \cdot I_1 = [V_3 \ I_3 \ I_2 \ I_1] \begin{bmatrix} -T_1 \\ K \cdot T_2 \\ K \\ h \end{bmatrix}$$

Because Formula 12 has a product-sum form of measurable values and unknown parameters, it complies with the standard form, Formula 13, of the general adaptive digital filter computing treatment $y = \omega^T \cdot \theta$ (Formula 13)

where $y = V_2$;

$\omega^T = [V_3, I_3, I_2, I_1]$; and $\theta^T = [-T_1, K \cdot T_2, K, h]$

Consequently, the signal obtained by filtering treatment of current I and voltage V can be used in the adaptive digital filter computing treatment to estimate unknown parameter vector θ.

In this application example, the two-limit trace gain system with improvement in the logic disadvantages of the simple adaptive digital filter with least square method is adopted. That is, in the two-limit trace gain system once the estimated value converges, even if the parameter varies later it still can be determined correctly again.

The following formulas, collectively Formulas 14, are parameter-estimating algorithms for estimating unknown parameter vector θ with Formula 13 as the precondition. The estimated value of the parameter at time k is θ(k).

$$\gamma(k) = \frac{\lambda_3}{1 + \lambda_3 \cdot \omega^T(k) \cdot P(k-1) \cdot \omega(k)};$$ (Formula 14)

$$\theta(k) = \theta(k-1) - \gamma(k) \cdot P(k-1) \cdot \omega(k) \cdot [\omega^T(k) \cdot \theta(k-1) - y(k)];$$

$$P(k) = \frac{1}{\lambda_1(k)} \left\{ P(k-1) - \frac{\lambda_3 \cdot P(k-1) \cdot \omega(k) \cdot \omega^T(k) \cdot P(k-1)}{1 + \lambda_3 \cdot \omega^T(k) \cdot P(k-1) \cdot \omega(k)} \right\} = \frac{P'(k)}{\lambda_1(k)};$$

$$\lambda_1(k) = \begin{cases} \frac{\text{trace}\{P'(k)\}}{\gamma_U} ; \lambda_1 \leq \frac{\text{trace}\{P'(k)\}}{\gamma_U} \\ \lambda_1 : \frac{\text{trace}\{P'(k)\}}{\gamma_U} \leq \lambda_1 \leq \frac{\text{trace}(P'(k))}{\gamma_{LI}} \\ \frac{\text{trace}\{P'(k)\}}{\gamma_L} ; \frac{\text{trace}(P'(k))}{\gamma_L} \leq \lambda_1 \end{cases}$$

In these formulas, $\lambda_1$, $\lambda_3$, $\lambda_U$ and $\gamma_L$ are initially set values, and $0 < \lambda_1 < 1$ and $0 < \lambda_3 < \infty$.

For P(0) a sufficiently large value is taken as the initial value, and for θ(0) a sufficiently small non-zero value is taken as the initial value. Trace{P} means the trace of matrix P. Also, $\lambda_3$ is a constant (adjustment gain) for setting the parameter-estimation speed of the adaptive digital filter computing treatment. A larger value corresponds to a higher estimation speed, while it becomes more amenable to the influence of noise.

Figures 4, 4A:
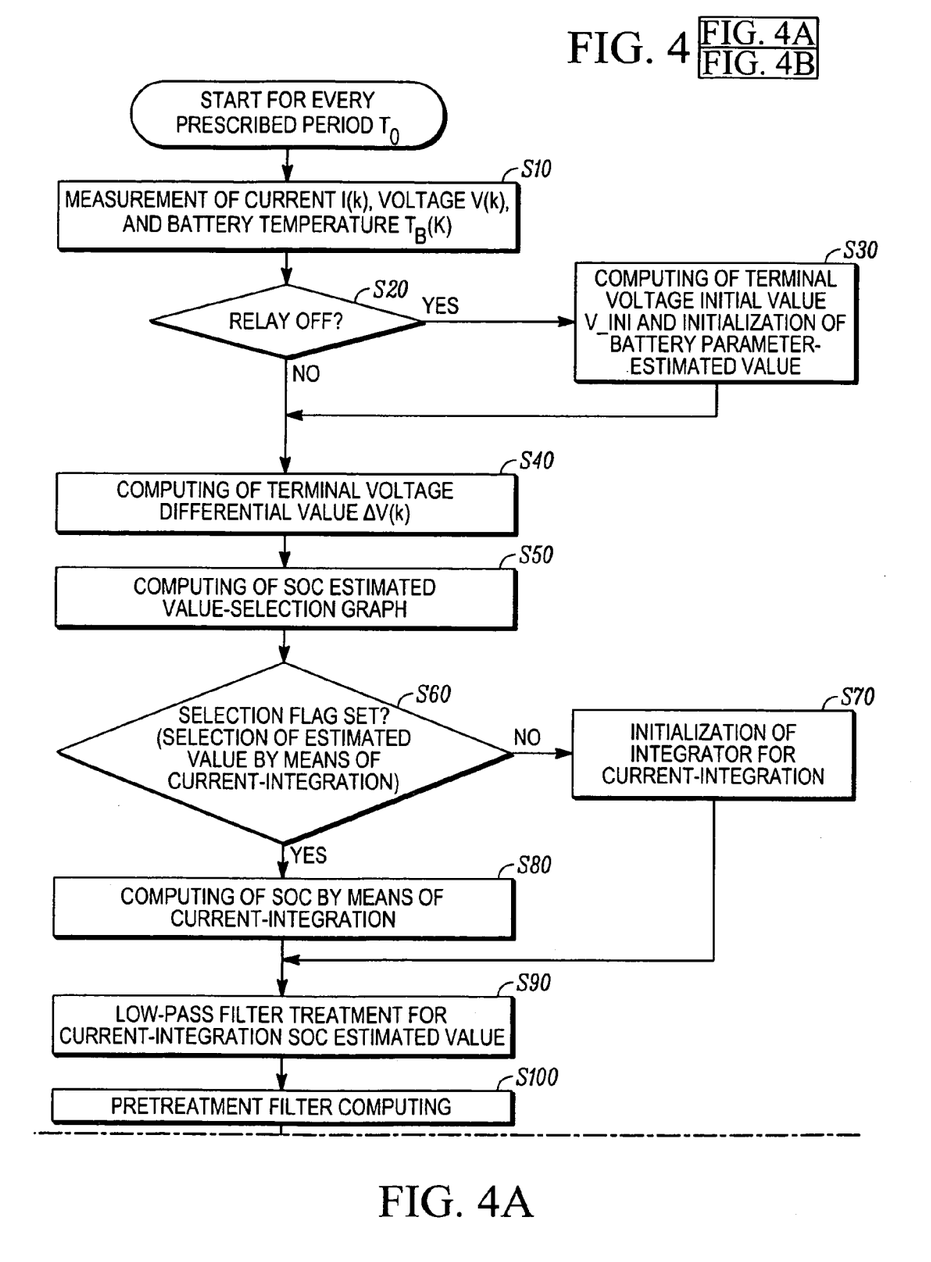
FIGS. 4A and 4B include a flow chart illustrating the process performed by the electronic control unit according to FIG. 2.
Figure 4B:
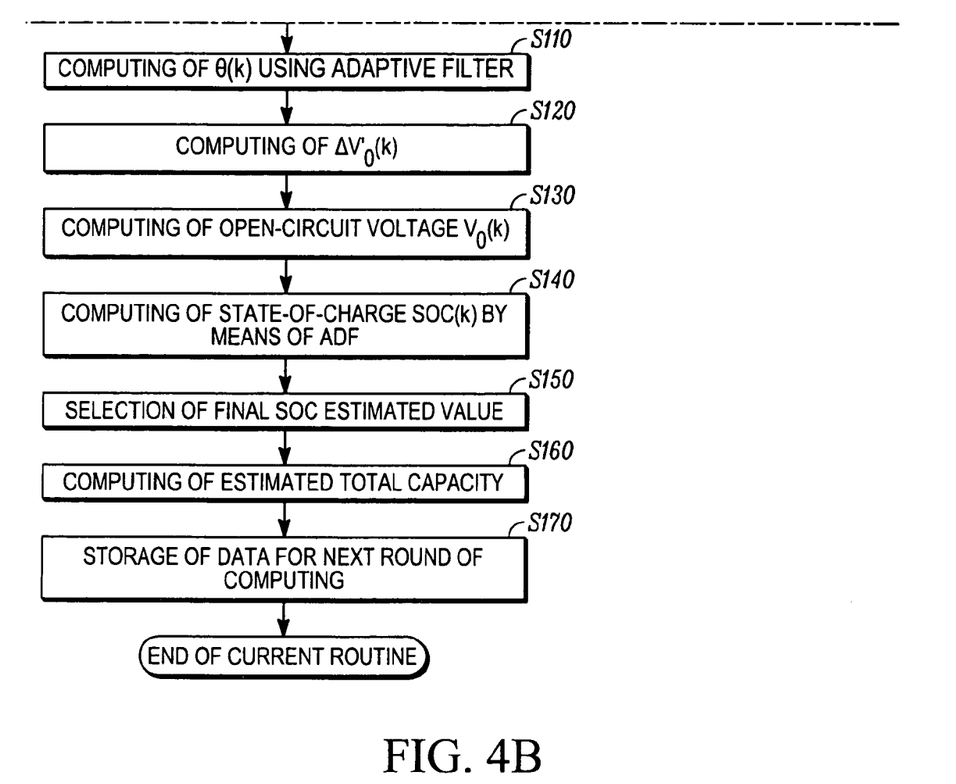

FIG. 4 is a flow chart illustrating the processing performed by electronic control unit 30. In this example, the order of the battery model is taken as primary. Also, the routine shown in FIG. 4 is carried out once every period $T_0$. For example, I(k) means the computing value of the current round, and I(k−1) means that of the preceding round.

At the beginning of processing, in step S10 current I(k) and terminal voltage V(k) are measured. Battery temperature $T_B(k)$ can also be measured.

In step S20 judgment is made on whether the cutoff relay of the secondary battery is cut off. Electronic control unit 30 also controls the cutoff relay of the secondary battery. When the relay is cut off (current I(k)=0), the process goes to step S30. When the relay is on, not off, the process advances to step S40.

In step S30 terminal voltage V(k) is stored as terminal voltage initial value V_ini. In step S40 terminal voltage differential value ΔV(k) is computed as ΔV(k)=V(k)−V_ini. Because the initial value of the estimated parameter in the adaptive digital filter computing treatment is about 0, at the start of the estimation operation all of the inputs are set at 0 so that the estimation parameters do not diverge. When the relay is cut off, because of the process through step S30 one has I=0 and ΔV(k)=0. Consequently, the estimated parameter remains in the initial state.

Next, in step S50 current deviation ΔI(k), representing the change in the current-per-unit time, that is, the current variation rate, is calculated as ΔI(k)=|I(k)−I(k−1)| where I(k) represents the measured current value of the current round and I(k−1) represents that of the preceding round. Based on current deviation ΔI(k), flag f_SOCSW that estimates which state-of-charge (SOC) estimated using the two methods to be explained later should be selected is set as follows.

When ΔI(k) is continuously below prescribed value β in a prescribed time $t_s$, that is, when the variation in the current is small, selection flag f_SOCSW is set. The estimated value of the state-of-charge estimated by means of current-integration (the estimated value of the state-of-charge estimated using second state-of-charge estimating part 7) is selected. In other cases selection flag f_SOCSW is cleared. That is, the estimated value of the state-of-charge estimated using the open-circuit voltage estimated with the adaptive digital filter (the estimated value of the state-of-charge estimated with first state-of-charge estimating part 6) is selected.

Also, as described below, one may also adopt a scheme in which selection flag f_SOCSW is set from current deviation ΔI(k) and the current value (absolute value).

More specifically, when I(k) or |I(k)| is larger than prescribed value α, and ΔI(k) is below prescribed value β continuously during a prescribed time $t_s$, selection flag f_SOCSW is set. That is, when current deviation ΔI(k) is small, and the current value (absolute value) is larger than a prescribed value, selection flag f_SOCSW is set. Setting this flag means that the estimated value of the state-of-charge estimated by means of current-integration (the estimated value of the state-of-charge estimated with second state-of-charge estimating part 7) is selected. In other cases, selection flag f_SOCSW is cleared. This means that the estimated value of the state-of-charge based on the open-circuit voltage estimated using the adaptive digital filter (the estimated value of the state-of-charge estimated with first state-of-charge estimating part 6) is selected.

In addition, instead of current deviation ΔI(k) under the mentioned conditions, one may also estimate the variation in current as the change width (maximum value−minimum value) of the current within a prescribed time.

Also, prescribed time $t_s$ may be set to vary corresponding to the current (absolute value). That is, as the absolute value of the current increases, the prescribed time $t_s$ can be decreased.

In step S60 selection is made as to whether the operation in estimating the state-of-charge (SOC) by means of current-integration is to be performed. When selection flag f_SOCSW is cleared the process goes to step S70, and the initialization treatment of the estimated value of the state-of-charge by means of current-integration is performed. On the other hand, when the flag is set, the process advances to step S80, and the state-of-charge is estimated by means of current-integration.

Also, in addition to the method based on current-integration, several methods may be adopted to estimate the state-of-charge when the current is constant while the battery parameters change. In one method, the output current and output voltage of the battery are detected in plural rounds, and the open-circuit voltage is estimated by estimating the correlation relationship between the output current and the output voltage (I-V characteristic) from the detected plural current values and voltage values. From the estimated open-circuit voltage and a previously derived relationship between an open-circuit voltage and a state-of-charge of the secondary battery, one can estimate the state-of-charge. In another method, a Carman filter is used.

Here, an explanation will be provided for an example in which a current-integration scheme is used to estimate state-of-charge (SOC). In step S70 initialization is performed for the estimated value of state-of-charge $SOC_i'(k)$ by means of current-integration of $SOC_a(k-1)$ as the estimated value of state-of-charge using the adaptive digital filter in the preceding round (that is, the estimated value of the state-of-charge estimated using the first state-of-charge estimating part) based on the following formula:

$$SOC_i'(k)=SOC_a(k-1).$$

Also, as shown in the following Formula 15 the offset value is estimated and initialized according to:

$$\Delta SOC_i(t) = \frac{1}{Q_{max}} \int_0^t I(t)\,dt; \text{ and} \qquad \text{(Formula 15)}$$

$$SOC_i(t) = \Delta SOC_i + SOC_a$$

where $Q_{max}$ is total capacity (i.e., the full capacity of the battery);

$SOC_a$ is the first estimated value of the state-of-charge (the estimated value of the state-of-charge using the state-of-charge estimating method by means of the adaptive digital filter); and $SOC_i$ is the second estimated value of the state-of-charge (estimated value of the state-of-charge by means of current-integration).

In step S80 estimated value of state-of-charge $SOC_i'$ is computed by means of current-integration using integration of the current based on the following Formula 16 using total capacity estimated value $Q_{max}$, to be explained later.

$$SOC_i'(k) = SOC_i'(k-1) + \frac{1}{Q_{max}(k-1)} I(k) \cdot T_0 \qquad \text{(Formula 16)}$$

Processing next advances to step S90. In step S90, as shown in Formulas 17 and 18 below, for the estimated value of the state-of-charge estimated by means of current-integration computed in step S80, low-pass filter treatment is performed with the same delay $G_{LPF}(s)$ as that in the treatment of pretreatment filter computing part 3 for computing the input signal to parameter-estimating computing part 4 (parameter-estimating part by means of adaptive digital filter computing treatment).

$$G_{LPF} = \frac{1}{(p \cdot s + 1)^3}; \text{ and} \qquad \text{(Formula 17)}$$

$$SOC_i = G_{LPF}(s) \cdot SOC_i' \qquad \text{(Formula 18)}$$

wherein p is the filter time constant (sec).

In practice, computing is performed using a recurrence formula obtained by discretion using the Tustin approximation or the like.

In step S100, based on Formulas 19 below, low-pass filter and band-pass filter treatment are performed on current I(k) and terminal voltage differential value ΔV(k) to estimate $I_1$-$I_3$ and $V_1$-$V_3$.

$$V_3 = s^2 \cdot G_{LPF}(s) \cdot \Delta V; \qquad \text{(Formulas 19)}$$

$$V_2 = s \cdot G_{LPF}(s) \cdot \Delta V;$$

$$V_1 = G_{LPF}(s) \cdot \Delta V;$$

$$I_3 = s^2 \cdot G_{LPF}(s) \cdot I;$$

$I_2 = s \cdot G_{LPF}(s) \cdot I;$ $I_1 = G_{LPF}(s) \cdot I.$

In practice, computing is performed using a recurrence formula obtained by means of the Tustin approximation or the like.

In step S110 the variables $I_1$-$I_3$, $V_2$-$V_3$ computed in step S100 are substituted in Formulas 14 to compute parameter-estimated value θ(k). Here, $y = V_2;$ $\omega^T = [V_3, I_3, I_2, I_1];$ and $\theta^T = [-T_1, K \cdot T_2, Kh].$ In step S120, from parameter-estimated value θ(k) computed in step S110, the values $T_1$, $K \cdot T_2$, $K$ and $I_1$-$I_2$ and $V_1$-$V_2$ computed with Formulas 19 are substituted into Formula 20 to compute open-circuit voltage $\Delta V_0'$.

$$\Delta V_O' = G_{lp}(s) \cdot \Delta V_O \qquad \text{(Formula 20)}$$
$$= G_{lp}(s) \cdot \{(T_1 \cdot s + 1) \cdot \Delta V - K \cdot (T_2 \cdot s + 1) \cdot I\}$$
$$= V_1 + T_1 \cdot V_2 - K \cdot T_2 \cdot I_2 - K \cdot I_1$$

Because Formula 20 is obtained by rearrangement of the battery model, Formula 3, and by multiplying low-pass filter $G_{LPF}(s)$ to both sides, actually it is the value obtained by applying the low-pass filter on the open-circuit voltage $\Delta V_0$, that is, $G_{LPF}(s)$ AVO. However, because the change in the open-circuit voltage is minimal, $\Delta V_0$ can be substituted by $G_{LPF}(s) \cdot \Delta V_0$.

The estimate here is variation $\Delta V_0(k)$ of the estimated value of the open-circuit voltage from the start of computing of the estimation. Consequently, the initial value is added in later step S130.

In step S130, the initial value of the open-circuit voltage, that is, the initial value of the terminal voltage V_ini, is added to $\Delta V_0'(k)$ computed in step S120 to compute estimated value of the open-circuit voltage $V_0(k)$ using the following formula:

$V_0(k) = \Delta V_0'(k) + V\_ini.$

Figure 5:
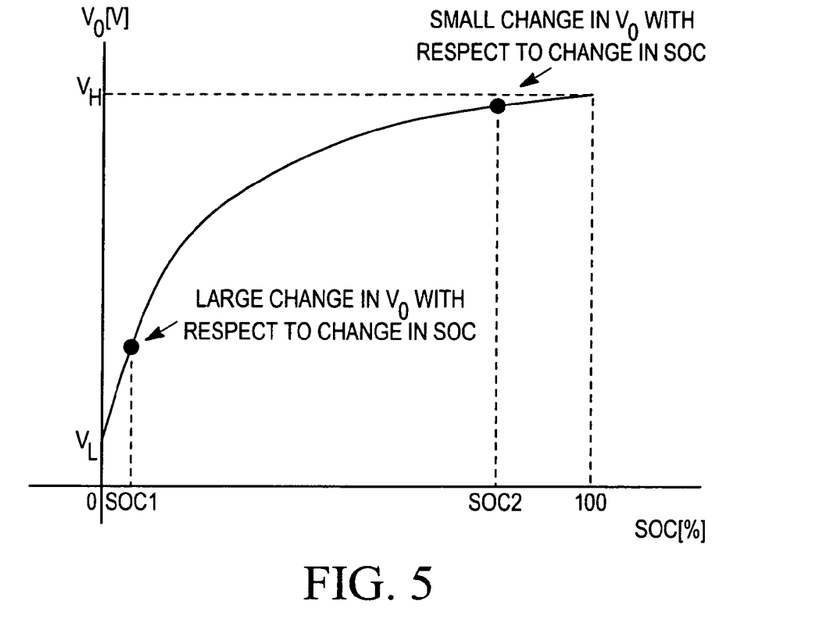
FIG. 5 is a graph illustrating the characteristics of the correlation relationship between the open-circuit voltage and the state-of-charge.

In step S140, the graph indicating the previously derived relationship between an open-circuit voltage and a state-of-charge of the battery shown in FIG. 5 is used to compute estimated value of state-of-charge $SOC_a(k)$ from $V_0(k)$ computed in step S130. In FIG. 5, $V_L$ represents the open-circuit voltage corresponding to state-of-charge (SOC)=0%, and $V_H$ represents the open-circuit voltage corresponding to state-of-charge (SOC)=100%.

In step S150, as the final state-of-charge estimated value $SOC_{est}(k)$, state-of-charge estimated value $SOC_a(k)$ is used. This state-of-charge estimated value is estimated using state-of-charge estimated value $SOC_i(k)$ by means of current-integration when the SOC selection flag computed in step S50 is set, or using the adaptive digital filter when the flag is cleared.

In step S160 total capacity $Q_{max}(k)$ is computed from state-of-charge $SOC_{est}(k)$ computed in step S150 and current I(k). The method for this operation, for example, is to derive it by dividing current I(k) by the time differential value of the state-of-charge estimated value as shown in the following Formula 21:

$$Q_{max} = \frac{1}{\frac{d}{dI}(SOC)} \qquad \text{(Formula 21)}$$

In step S170 the numeric data needed for the operation of the next round are kept, and the operation of the current round comes to an end.

In the following, an explanation will be given regarding the effect of the invention by means of simulation.

Figure 6:
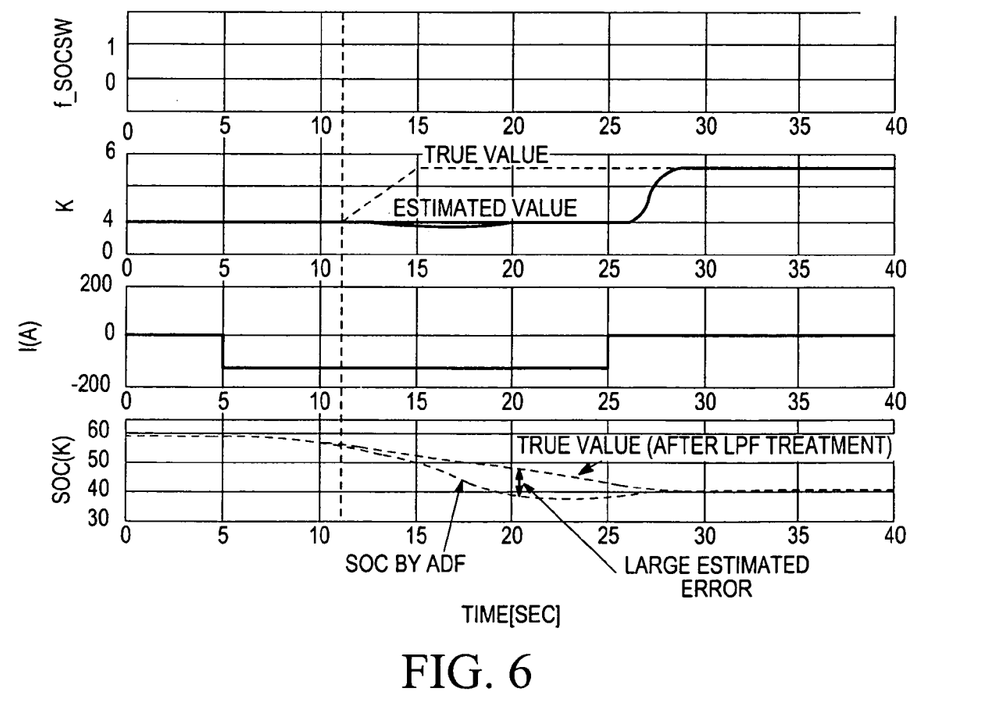
FIG. 6 includes charts illustrating the results of simulated operation in a comparative example.
Figure 7:
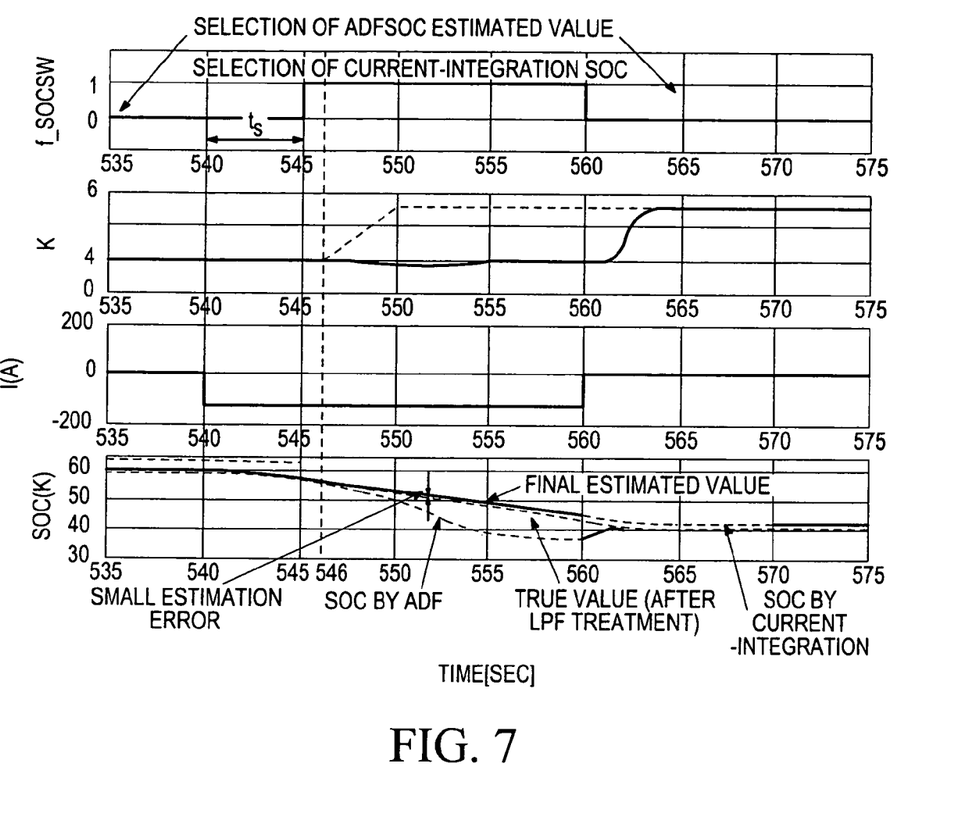
FIG. 7 includes charts illustrating the results of simulated operation according to one embodiment of the invention.

FIGS. 6 and 7 illustrate examples of such simulations. They illustrate the results if internal resistance K slowly increases in the period of 6-11 sec when the current is stepwise changed from 0 to −120 A (discharge) at the time point of 5 sec. FIG. 6 shows a comparative example. It shows the characteristics when only the open-circuit voltage estimated by the adaptive digital filter computing treatment is used, that is, the characteristics when the invention is not completely adopted. FIG. 7 is a diagram illustrating the characteristics of the invention.

As shown in FIG. 6, in the comparative example there is no change in the current during the period from 5 sec to 25 sec, and after 6 sec the internal resistance K increases at 11 sec. Because there is no change in the current, in the adaptive digital filter computing treatment the change in the internal resistance cannot be estimated. Consequently, there is a large error between the state-of-charge estimated value and the true value (actual state-of-charge).

On the other hand, as shown in FIG. 7, at the time of 540 sec, just as in FIG. 6, the current is stepwise changed from 0 to −120 A (discharge). Then, during the period of 540-560 sec there is no change in the current, and after 6 sec the internal resistance K increases at 546 sec. However, by means of current-integration, the state-of-charge estimated value output from 545 sec after a prescribed time $t_s$ (switching condition time $t_s$ is set at 5 sec) from 540 sec is switched to the state-of-charge estimated value determined by current-integration. Consequently, even during the period when there is an error between the state-of-charge estimated value and the true value (actual state-of-charge) in the comparative example, the error still is small for the state-of-charge estimated value that is finally output.

Also, the initial value of the integrator at the switching time is taken as the result of estimation using the adaptive digital filter computing treatment up to that time. Consequently, it is possible to avoid the problem of accumulation of error in the integrator due to long-time integration as would take place if only the state-of-charge estimated value by means of current-integration is used, and it is possible to estimate the state-of-charge (SOC) with high precision at all times.

As explained above, the adaptive digital filter computing treatment with high precision of estimation is used, and discharge is continued with a large constant current so that the internal resistance soon rises (or falls). As a result, when error occurs in the state-of-charge estimated value by the adaptive digital filter computing treatment, the state-of-charge estimated value by other methods (such as the state-of-charge estimated value by means of current-integration) is selected. State-of-charge (SOC) can be estimated with high precision at all times.

Also, in a lithium ion battery when the discharge current is relatively small, the mentioned phenomenon of rapid rise in the internal resistance does not take place. In addition, when the current falls the proportion of noise (S/N ratio)

increases, and it is possible for the error to become larger for the state-of-charge estimated value (second state-of-charge estimated value) computed from the current-integration value. Also, by decreasing the switching frequency of the state-of-charge as much as possible the continuity of the estimated value can be increased. For these reasons, it is possible to increase the estimation precision by selecting the state-of-charge estimated value based on the current-integration only when the current variation rate or change width is smaller than a prescribed value and the current (absolute value) is over a prescribed value α within a prescribed time, and otherwise selecting the state-of-charge estimated value (the first state-of-charge estimated value) using the adaptive digital filter computing treatment.

In addition, when switching is made from the first state-of-charge estimated value to the second state-of-charge estimated value, the first state-of-charge estimated value just before switching is taken as the initial value of the second state-of-charge estimated means to start the integration. In this option, the estimated value evolves continuously even if the method of estimation of the state-of-charge is switched. In addition, compared with other initialization methods, such as initialization when the power is turned ON or when the current is zero, the estimation error can be minimized for initialization with the first state-of-charge estimated value believed to have the smallest estimation error just before start of current-integration by the second state-of-charge estimating means.

Also, for an embodiment in which a low-pass filter with the same delay as that of the pretreatment filter in the adaptive digital filter computing treatment is applied to the second state-of-charge estimated value, it is possible to reduce the phase difference between the first state-of-charge estimated value and the second state-of-charge estimated value. Hence, the state-of-charge can always be estimated with high stability (with constant transmission characteristics).

If the estimated value of the battery parameters estimated by means of the adaptive digital filter computing treatment does not change or changes opposite the predicted distribution while the current variation rate or change width is smaller than prescribed value β and the variation in battery parameters is as predicted under the conditions, the second state-of-charge estimated value is selected. Otherwise, the first state-of-charge estimated value is selected. In this embodiment, deviation takes place from the true value for the first state-of-charge estimated value estimated using the adaptive digital filter computing treatment, and the second state-of-charge estimated value is selected. Thus, the precision of the state-of-charge estimated value can be made even higher.

In addition, when prescribed time $t_s$ used in judgment of the switching between the first state-of-charge estimated value and the second state-of-charge estimated value is set to vary corresponding to the current (absolute value). That is, when prescribed time $t_s$ is set shorter as the absolute value of the current increases, when change in the battery parameters of discharge with a large current is as predicted, quick switching to the second state-of-charge estimated value occurs. Also, when the current is small, the proportion of selection of the second state-of-charge estimated value that is likely to be influenced by noise of the input signal is reduced, so it is possible to improve the precision of the overall state-of-charge estimated value.

Also, the above-described embodiments have been described in order to allow easy understanding of the present invention and do not limit the present invention. On the contrary, the invention is intended to cover various modifications and equivalent arrangements included within the scope of the appended claims, which scope is to be accorded the broadest interpretation so as to encompass all such modifications and equivalent structure as is permitted under the law.

What is claimed is:

1. A state-of-charge estimating device for estimating a state-of-charge of a secondary battery connected to a load, comprising:
   a current detecting device for detecting a current I of the secondary battery;
   a terminal voltage detecting device for detecting a terminal voltage V of the secondary battery; and
   a controller receiving input from the current detecting device and the terminal voltage detecting device, the controller including:
   an open-circuit voltage estimating part operable to perform an adaptive digital filter computing treatment to estimate at least one battery parameter in a battery model $$V = \frac{B(s)}{A(s)} \cdot I + \frac{1}{A(s)} \cdot V_O$$

en bloc based on the current I and terminal voltage V of the secondary battery and the battery model $$V = \frac{B(s)}{A(s)} \cdot I + \frac{1}{A(s)} \cdot V_O$$

and to estimate an estimated open-circuit voltage $V_O$ of the secondary battery, wherein A(s) and B(s) are polynomials of Laplace operator s;
   a first state-of-charge estimating part operable to estimate a first state-of-charge value based on the estimated open-circuit voltage $V_O$ of the secondary battery and a previously derived relationship between an open-circuit voltage and a state-of-charge of the secondary battery;
   a second state-of-charge estimating part operable to estimate a second state-of-charge value using a method capable of estimating the state-of-charge even if the current I is constant while one or more of the at least one battery parameter varies; and
   a state-of-charge estimated value-selecting part operable to switch from the first state-of-charge value to the second state-of-charge value as the state-of-charge when the current I is constant and otherwise to select the first state-of-charge value as the state-of-charge.

2. The state-of-charge estimating device according to claim 1 wherein the second state-of-charge estimating part is operable to estimate the second state-of-charge value using the method wherein the method excludes the estimated open-circuit voltage $V_O$ that is estimated by the open-circuit voltage estimating part.

3. The state-of-charge estimating device according to claim 1 wherein the second state-of-charge estimating part is further operable to estimate the second state-of-charge value based on at least one of the current I detected by the current detecting device and the terminal voltage V detected by the terminal voltage detecting device before performing the adaptive digital filter computing treatment.

4. The state-of-charge estimating device according to claim 1 wherein the state-of-charge estimated value-selecting part is further operable to determine that the current I is constant when a variation rate of the current I over time is continuously lower than a prescribed variation rate over a prescribed time.

5. The state-of-charge estimating device according to claim 4 wherein the state-of-charge estimated value-selecting part is further operable to select the second state-of-charge value only when the variation rate of the current I is smaller than the prescribed variation rate and an absolute value of the current is larger than a prescribed value continuously for the prescribed time, and otherwise is operable to select the first state-of-charge.

6. The state-of-charge estimating device according to claim 1 wherein the state-of-charge estimated value-selecting part is further operable to determine the current I is constant when a change width of the current I is continuously smaller than a prescribed change width over a prescribed time.

7. The state-of-charge estimating device described in claim 6 wherein the state-of-charge estimated value-selecting part is further operable to select the second state-of-charge value only when the change width of the current I is smaller than the prescribed change width and an absolute value of the current I is larger than a prescribed value continuously for the prescribed time, and otherwise is operable to select the first state-of-charge value.

8. The state-of-charge estimating device according to claim 1 wherein the second state-of-charge estimating part is further operable to estimate the second state-of-charge value by integrating the current I detected using the current detecting device.

9. The state-of-charge estimating device according to claim 8 wherein the second state-of-charge estimating part is further operable to estimate a total capacity of the secondary battery, and to estimate the second state-of-charge value by integrating the current I based on the estimated total capacity and a formula $$SOC_i'(k) = SOC_i'(k-1) + \frac{1}{Q_{\max}(k-1)} I(k) \cdot T_0$$

wherein $Q_{max}$ represents the total capacity; $SOC_i'(k)$ represents a value of the second state-of-charge computed in a current estimation round; $SOC_i'(k-1)$ represents a value of the second state-of-charge in a preceding estimation round; and $T_0$ represents a prescribed period for each round.

10. The state-of-charge estimating device according to claim 8 wherein the second state-of-charge estimating part is further operable, when the state-of-charge estimated value-selecting part changes from a state of selection of the first state-of-charge value to a state of selection of the second state-of-charge value, to use the first state-of-charge value just before selection of the second state-of-charge value as an initial value and to start integration of the current I.

11. The state-of-charge estimating device according to claim 1 wherein the second state-of-charge estimating part is further operable to detect a correlation relationship between the current I and the terminal voltage V from the current I detected using the current detecting device and the terminal voltage V detected using the terminal voltage detecting device, to estimate the estimated open-circuit voltage $V_O$ of the secondary battery based on the correlation relationship, and to estimate the second state-of-charge value based on the estimated open-circuit voltage $V_O$.

12. The state-of-charge estimating device according to claim 1 wherein the first state-of-charge estimating part is operable to perform the adaptive digital filter computing treatment based on values for the current I and terminal voltage V obtained by applying a low-pass-filter or band-pass filter treatment on the current I and terminal voltage V; and wherein the second state-of-charge estimating part is operable to perform filter treatment having equal delay characteristics to those of the low-pass filter or band-pass filter on the second state-of-charge value.

13. The state-of-charge estimating device according to claim 1 wherein the state-of-charge estimated value-selecting part is further operable to select the second state-of-charge value when there is no change in the at least one battery parameter estimated using the adaptive digital filter computing treatment or when the at least one battery parameter estimated with the adaptive digital filter computing treatment changes in a direction opposite a predicted trend under conditions wherein the current I is constant and variation in the at least one battery parameter is as predicted, and otherwise is operable to select the first state-of-charge value.

14. The state-of-charge estimating device according to claim 1 wherein an amount of time used by the state-of-charge estimated value-selecting part to select from the first state-of-charge value and the second state-of-charge value decreases when an absolute value of the current I increases.

15. The state-of-charge estimating device according to claim 1 wherein the open-circuit voltage estimating part further comprises a parameter-estimating part operable to use the adaptive digital filter computing treatment to perform en bloc estimation of the at least one battery parameter in modified battery model $G_{LPF}(s) \cdot A(s) \cdot s \cdot V = G_{LPF}(s) \cdot \{B(s) \cdot s + h\} I$ wherein $G_{LPF}(s)$ represents transmission characteristics of a low-pass filter of the adaptive digital filter computing treatment and h represents variable efficiency; and wherein the open-circuit voltage estimating part is further operable to compute the estimated open-circuit voltage $V_O$ from the current I and terminal voltage V and the at least one battery parameter wherein $$A(s) = \sum_{k=0}^{n} a_k \cdot s^k; B(s) = \sum_{k=0}^{n} b_k \cdot s^k; k$$

is a current estimation round; and n is a total number of estimation rounds.

16. The state-of-charge estimating device according to claim 15 wherein the second state-of-charge estimating part is operable to estimate the second state-of-charge value using the method wherein the method excludes the estimated open-circuit voltage $V_O$ that is estimated by the open-circuit voltage estimating part.

17. The state-of-charge estimating device according to claim 15 wherein the second state-of-charge estimating part is further operable to estimate the second state-of-charge value based on at least one of the current I detected by the current detecting device and the terminal voltage V detected by the terminal voltage detecting device before performing the adaptive digital filter computing treatment.

18. The state-of-charge estimating device according to claim 15 wherein the second state-of-charge estimating part is further operable to estimate the second state-of-charge value by integrating the current I detected with the current detecting device.

19. The state-of-charge estimating device according to claim 18 wherein the second state-of-charge estimating part is further operable to estimate a total capacity of the secondary battery, and to estimate the second state-of-charge value by integrating the current I based on the estimated total capacity and a formula $$SOC_i'(k) = SOC_i'(k-1) + \frac{1}{Q_{\max}(k-1)} I(k) \cdot T_0$$

wherein $Q_{max}$ represents the total capacity; $SOC_i'(k)$ represents a value of the second state-of-charge computed in a current round; $SOC_i'(k-1)$ represents a value of the second state-of-charge in a preceding round; and $T_0$ represents a prescribed period for each round.

20. The state-of-charge estimating device according to claim 18 wherein the second state-of-charge estimating part is further operable, when the state-of-charge estimated value-selecting part changes from a state of selection of the first state-of-charge value to a state of selection of the second state-of-charge value, to use the first state-of-charge value just before selection of the second state-of-charge value as an initial value and to start integration of the current I.

21. The state-of-charge estimating device according to claim 15 wherein the second state-of-charge estimating part is further operable to detect a correlation relationship between the current I and the terminal voltage V from the current I detected using the current detecting device and the terminal voltage V detected using the terminal voltage detecting device, to estimate the estimated open-circuit voltage $V_O$ of the secondary battery based on the correlation relationship, and to estimate the second state-of-charge value based on the estimated open-circuit voltage $V_O$.

22. The state-of-charge estimating device described in claim 15 wherein the first state-of-charge estimating part is operable to perform the adaptive digital filter computing treatment based on values for the current I and terminal voltage V obtained by applying a low-pass-filter or band-pass filter treatment on the current I and terminal voltage V; and wherein the second state-of-charge estimating part is operable to perform filter treatment having equal delay characteristics to those of the low-pass filter or band-pass filter on the second state-of-charge value.

23. The state-of-charge estimating device described in claim 15 wherein the state-of-charge estimated value-selecting part is further operable to select the second state-of-charge value when there is no change in the at least one battery parameter estimated using the adaptive digital filter computing treatment or when the at least one battery parameter estimated with the adaptive digital filter computing treatment changes in a direction opposite a predicted trend under conditions wherein the current I is constant and variation in the at least one battery parameter is as predicted, and otherwise is operable to select the first state-of-charge value.

24. The state-of-charge estimating device described in claim 15 wherein an amount of time used by the state-of-charge estimated value-selecting part to select from the first state-of-charge value and the second state-of-charge value decreases when an absolute value of the current I increases.

25. A state-of-charge estimating device for estimating a state-of-charge of a secondary battery connected to a load, comprising:

means for detecting a current I through the secondary battery;

means for detecting a terminal voltage V of the secondary battery;

open-circuit voltage estimating means for performing an adaptive digital filter computing treatment to estimate at least one battery parameter in a battery model $$V = \frac{B(s)}{A(s)} \cdot I + \frac{1}{A(s)} \cdot V_O$$

en bloc based on the current I and terminal voltage V of the secondary battery and the battery model $$V = \frac{B(s)}{A(s)} \cdot I + \frac{1}{A(s)} \cdot V_O$$

and to estimate an estimated open-circuit voltage $V_O$ of the secondary battery, wherein A(s) and B(s) are polynomials of Laplace operator s; and state-of-charge estimating means for estimating the state-of-charge based on the estimated open-circuit voltage $V_o$ of the secondary battery and a previously derived relationship between an open-circuit voltage and a state-of-charge of the secondary battery when the current I is not constant and for switching the state-of-charge to an estimate using a state-of-charge estimating method that allows estimation of the state-of-charge excluding the open-circuit voltage $V_O$ when the current I is constant.

26. A state-of-charge estimating method for estimating a state-of-charge of a secondary battery connected to a load, comprising:

detecting a current I through the secondary battery;

detecting a terminal voltage V of the secondary battery;

performing an adaptive digital filter computing treatment to estimate at least one battery parameter in a battery model $$V = \frac{B(s)}{A(s)} \cdot I + \frac{1}{A(s)} \cdot V_O$$

en bloc based on the current I and terminal voltage V of the secondary battery and the battery model $$V = \frac{B(s)}{A(s)} \cdot I + \frac{1}{A(s)} \cdot V_O$$

and to estimate an estimated open-circuit voltage $V_O$ of the secondary battery, wherein A(s) and B(s) are polynomials of Laplace operator s; and estimating a first state-of-charge value based on the estimated open-circuit voltage $V_O$ of the secondary battery and a previously derived relationship between an open-circuit voltage and a state-of-charge;

estimating a second state-of-charge value using a method capable of estimating the state-of-charge even if the current I is constant while one or more of the at least one battery parameter varies;

switching from the first state-of-charge value as the state-of-charge to the second state-of-charge value as the state-of-charge when the current I is constant; and selecting the first state-of-charge value as the state-of-charge when the current I varies.

27. The state-of-charge estimating device described in claim 25, further comprising:

state-of-charge selecting means for selecting, when the current I is not constant, the state-of-charge estimated based on the estimated open-circuit voltage $V_O$ of the secondary battery and the previously derived relationship; and for selecting, when the current I is constant, the state-of-charge estimating method that allows estimation of the state-of-charge excluding the open-circuit voltage $V_O$ when the current I is constant; and wherein an amount of time used by the state-of-charge selecting means to perform the selecting decreases when an absolute value of the current I increases.

\* \* \* \* \*